United States Patent [19]

Crowe

[11] Patent Number: 4,941,530
[45] Date of Patent: Jul. 17, 1990

[54] ENHANCED AIR FIN COOLING ARRANGEMENT FOR A HERMETICALLY SEALED MODULAR ELECTRONIC COLD PLATE UTILIZING REFLUX COOLING

[75] Inventor: Lawrence E. Crowe, Lindenwood, Ill.

[73] Assignee: Sundstrand Corporation, Rockford, Ill.

[21] Appl. No.: 296,820

[22] Filed: Jan. 13, 1989

[51] Int. Cl.$^5$ .................. F28D 15/02; H01L 23/42
[52] U.S. Cl. .................... 165/104.33; 165/104.14; 165/104.21; 361/385
[58] Field of Search ............. 165/104.33, 104.21, 165/104.11, 104.14; 361/385

[56] References Cited

U.S. PATENT DOCUMENTS

| 2,883,591 | 4/1959 | Camp . | |
|---|---|---|---|
| 3,100,969 | 8/1963 | Elfving | 165/104.21 |
| 3,324,667 | 6/1967 | Muller | 165/104.21 |
| 4,635,709 | 1/1987 | Altoz . | |
| 4,727,454 | 2/1988 | Neidig . | |
| 4,727,455 | 2/1988 | Neidig . | |

FOREIGN PATENT DOCUMENTS 217346 12/1984 Japan .

Primary Examiner—Albert W. Davis, Jr.
Attorney, Agent, or Firm—Antonelli, Terry, Stout & Kraus

[57] ABSTRACT

A modular reflux cooling plate (10) having a condenser region (11) above the boiling channels (12) or above and below (11,24) the region (11), boiling channels (12) and downcomers (16) which effect reflux cooling of electrical power modules used in aircraft and the like. Air flow fins (18) are arranged adjacent the condenser (11) or condensers (11,24) and the boiling channels (12) to effect cooling of a coolant vapor which has entered the condenser (11) after being boiled from a liquid state in the boiling channels (12) as a result of the heat generated by one or more power modules affixed to an end plate (14) by any suitable means and to provide a parallel heat transfer path which shares the heat transfer task with the reflux cooling during normal system operation and which provides emergency heat transfer when reflux cooling is not available.

6 Claims, 3 Drawing Sheets

ENHANCED AIR FIN COOLING ARRANGEMENT FOR A HERMETICALLY SEALED MODULAR ELECTRONIC COLD PLATE UTILIZING REFLUX COOLING

CROSS REFERENCE TO RELATED APPLICATION

This application is related to an application entitled "Hermetically Sealed Modular Electronic Cold Plate Utilizing Reflux Cooling" in the name Lawrence E. Crowe filed Oct. 31, 1988, the contents of which are incorporated by reference herein.

TECHNICAL FIELD

The present invention relates to a hermetically sealed modular electronic cold plate. More particularly, the present invention relates to an arrangement for providing enhanced air cooling on a reflux cooled cold plate used, for example, in electrical power systems on aircraft in which large, pressure-mounted semiconductors are incorporated for switching purposes.

BACKGROUND ART

In the past, efficient high-flux cooling has been achieved by either wick-type heat pipes or by direct immersion of the device to be cooled in a heat sink liquid. However, each of these types of devices has disadvantages which limits the use thereof in aircraft application in which large switching semiconductors are used, thereby creating a large amount of heat dissipation in a small space.

Wick-type heat pipes are limited by the rate at which cooling fluid can be returned from a condensing zone to a boiling zone adjacent the device being cooled. Conventional wick materials do not achieve sufficiently high heat flux rates to maintain acceptable temperatures in modern electrical power systems with high heat dissipation.

In the latter type of device, circuits are submerged in a fluorocarbon fluid such as freon within a sealed enclosure. As the components dissipate heat, the fluid boils and the vapor bubbles rise to the top of the sealed enclosure to cause reflux cooling. The vapor is then cooled by extracting heat from the top of the enclosure which causes the vapor to condense and return back to the bottom surrounding the circuits for another heating cycle.

Although direct immersion cooling in which the device being cooled causes boiling of a liquid which is later condensed and recycled is very efficient, servicing of the device requires draining the liquid which surrounds it in order to gain access to the device. The device which is cooled by direct immersion must also be packaged in a way which prevents damage from the cooling liquid to the electronic components. This requires extraordinary precautions to make sure that the device is hermetically sealed even after it has been serviced or repaired. Moreover, additional difficulties are encountered in attempting to connect electrical circuits outside the direct immersion sealed enclosure without leakage of the coolant.

Reflux cooling devices also create internal pressures within the sealed chamber. In the past, this has required greater wall thicknesses and higher overall weight of the reflux enclosure to meet acceptable pressure vessel design criteria. Conventional approaches have not permitted manufacturers to achieve a more compact overall package shape, which is particularly important in aircraft applications. In the event of failure of the reflux cooling caused by leakage of the coolant, there is the further problem that the device will lose all cooling capacity leading to catastrophic failure of the modules. Even temporary cessation of reflux cooling caused by inverted operation or negative "g" forces can cause undesirable results.

The use of direct immersion reflux cooling enclosures also has the disadvantage that different circuits immersed in the enclosure will be required to operate at the temperature of the highest heat flux component. This arises from the uniformity of pressure within the vessel which means that all components must operate at the same temperature even if this is not desired for one or more circuits within the enclosure.

Others have attempted to improve upon these two types of cooling arrangements in various ways. In one instance, as shown in Japanese Patent Application No. 59-217346, a vapor cooling device is provided in which the semiconductor elements to be cooled are disposed externally at the lower part of a liquid reservoir containing a coolant which changes phases between the liquid phase and the vapor phase. As the vaporized coolant rises through a vapor phase pipe 9, it reaches a condensation part where it is condensed between a secondary coolant and then returned to a reservoir through a liquid phase pipe where vapor cooling again begins. However, as a result of this arrangement, it is not possible to stack semiconductor elements in a way which would make the use of the device particularly desirable in the cramped environment of an aircraft. Furthermore, the large internal volume in this arrangement makes it especially undesirable for aircraft use where a small internal volume is necessary because of space considerations in the fuselage, and it does not permit the use of multiple plates to permit different packages from running at different temperatures. In the event of the loss of the liquid coolant, cooling of the semiconductor elements ceases.

Given critical space considerations within aircraft, conventional heat exchangers have also not permitted maximum utilization of space for electrical and electronic packages while, at the same time, permitting adequate cooling. Known heat exchangers are constructed in a way which do not address the problem of configuration. This becomes particularly acute in modern aircraft applications where electronic component power ratings, circuit size and packaging density have increased to address the power requirements for aircraft.

More recently, semiconductor power modules have been proposed in which a heat pipe or capillaries are used to cool the power module. In this connection, U.S. Pat. Nos. 4,727,454 and 4,727,455 are illustrative of these proposals. In one such conventional embodiment, at least one semiconductor power component with a base surface which is soldered to a metallized ceramic substrate. At least one heat conduit or pipe is integrated into the semiconductor power module. The heat conduit includes a condensation area having a larger surface than the base surface over which dissipation heat from the semiconductor power module is distributed. The use of such a module in aircraft applications wherein changes in altitude and "g" forces cause migration of the operating fluid away from the power device to be cooled, thereby decreasing the cooling efficiency, does not provide the overall performance needed in an aircraft electrical power system heat exchanger, particularly in the event of loss of the operating fluid.

U.S. Pat. No. 4,635,709 attempts to address problems associated with the cooling of electronic devices in aircraft applications in a dual mode. It does so by using air as the primary cooling mode during normal conventional flight. However, a second cooling mode is provided for conditions when air cooling is insufficient or will damage the electronics. This second cooling mode provides a coolant in cold plate grooves. Water or methanol can be used as the coolant which is caused to boil or evaporate as the cold plate heats up. However, this heat exchanger is not intended to work in conjunction with the air flow in order to obtain the cooling benefits of both air cooling and evaporative cooling during normal operation. Furthermore, it requires that the electronics module be made an integral part of the cooling plate. It also has the disadvantage that the coolant is exhausted overboard and thus is not intended to be recirculated to allow for continuous use, thereby requiring more servicing.

DISCLOSURE OF INVENTION

It is an object of the present invention to overcome the disadvantages encountered with prior art cooling devices and to provide a cooling arrangement with an enhanced air cooling arrangement which is particularly adapted for use in electric power systems which incorporate large, pressure mounted switching semiconductors of the type typically used on board aircraft where efficient, high-flux cooling is absolutely essential.

It is a further object of the present invention to obtain the advantages of both high capacity reflux cooling without the disadvantages of direct immersion of a circuit within a cooling liquid and air cooling during normal operation.

It is a further object of the present invention to provide a hermetically sealed modular electronic cold plate utilizing reflux cooling in which the rate at which cooling liquid is returned from a condensing zone to a boiling zone adjacent to the device being cooled is not limited as is the case with wick-type cooling and yet is simple in construction and avoids the previous drawbacks in package configuration, weight and operation.

It is yet a further object of the present invention to provide a hermetically sealed modular electronic cold plate which provides a cooling capacity equivalent to direct immersion cooling but which avoids the need to drain the immersion liquid in order to gain access to the electronic system.

It is another object of the present invention to provide a cold plate which provides sufficient air cooling through a parallel cooling path in the event of loss of reflux cooling to continue to provide some degree of heat transfer for the heat generating components and thereby to permit a relatively graceful failure mode without catastrophic consequences.

The foregoing objects and advantages of the present invention have been achieved by the provision of a hermetically sealed compact modular electronic cold plate in which a cooling liquid, such as water or a fluorocarbon, is enclosed within a relatively thin sealed enclosure. One or more electrical power devices to be cooled are compression mounted adjacent to the outer surface of one end plate of the enclosed metal box so as to receive heat from the device without the use of solder which is unacceptable in high power devices. This heat causes the liquid within the enclosure to change to the vapor phase. A condenser located above the boiler elements and devices being cooled to provide a flatter, more compact module receives the boiling vapors through the boiling channels and, as a result of heat exchange with a cooler liquid, lowers the temperature of the vapor and causes condensation on lanced condensing fins which subject the vapor to a tortuous path to maximize condensation. The condensed liquid then flows by gravity through downcomer channels to collect in a pool of liquid at the bottom of the apparatus where it is continuously recycled, reboiled and recondensed. Air cooling fins are provided along the entire face of the other end plate of the box to provide a cooling path parallel to the reflux cooling path.

BRIEF DESCRIPTION OF THE DRAWINGS

These and other objects, advantages and features of the present invention will become more apparent from the following detailed description when taken in conjunction with the accompanying drawings wherein.

BEST MODE FOR CARRYING OUT THE INVENTION

Figure 1:
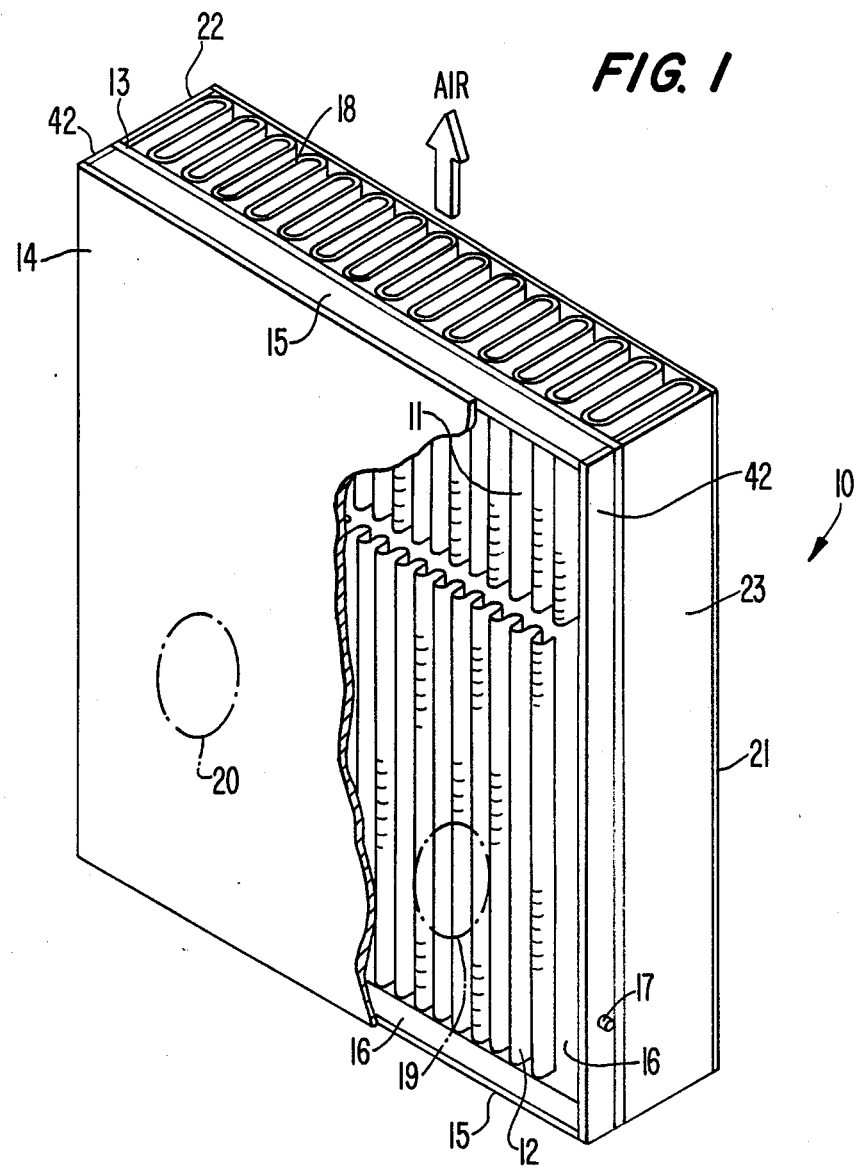
FIG. 1 is a perspective view shown in partial cross-section of the hermetically sealed modular electronic cold plate utilizing the principles of the present invention.

Referring now to the drawings and, in particular, to FIG. 1, there is shown a modular reflux heat sink cold plate which embodies the essential concepts of the present invention. In particular, the relatively thin, flat rectangular plate designated generally by the numeral 10 comprises a condenser region 11 in the form of lanced offset fins of conventional construction and an area below the condenser region 11 where there are provided boiling channels 12 in the form of lanced offset fins and downcomer channels 16 for reasons to be explained herein below.

The reflux plate 10 is fluid-tightly sealed around the condenser region 11 and the channels 12,16 by relatively thin rectangular end sheets 13,14 defining each end face. The end sheets can be made of a clad metal whose properties can be selected for optimal heat exchange characteristics in accordance with known principles. Separating edge closure 15 and 42 are brazed to the peripheries of the end sheets 13,14 so as to define a rectangularly shaped space inside the cold plate 10 of sufficient volume to accommodate the condenser fins 11 and the boiling channel fins 12. In terms of assembly, the edge closure 15 and 42 can first be arranged completely around the periphery of end sheet 13. Then the condenser region lanced offset fins 11 and the boiling channel lanced offset fins 12 can be arranged within the space defined by the edge closure bars. The boiling channel fins 12 are sized in such a way that they do not extend across the entire width of the space defined by the edge closure bars 42 running along the long sides of the end sheet 13 and at the bottom of the boiling channel fins 12. On each side of the cold plate 10, a downcomer 16 is defined between the edge closure bar 42 and the end of the boiling channels 12 as well as between the bottom of the boiling channels 12 and edge closure bar 15.

As illustrated in FIG. 1, the boiling channels 12 do not abut against the condenser fins 11 but define a space therebetween. It will be appreciated that in some instances, it may not be desirable to have such a space. Thus, the present invention contemplates the condenser region abutting the boiling channels.

After the condenser fins 11 and boiling channel fins 12 have been appropriately located within the cavity to define the downcomers 16 on each side, the end sheet 14 is clamped in place, and the entire assembly is brazed. During this brazing process, the clad material on the end plates 13,14 is heated to a sufficiently high temperature to cause the portions of the lanced offset fins touching the end plates to be brazed thereto, thereby providing further structural rigidity and strength for the cold plate 10 to withstand internal pressures caused by the reflux cooling described below.

A series of plate fins 18 bounded by an end plate 21 and edge bars 22,23 through which air or the like can be caused to flow to cool the plate is arranged on the side of end plate 13 so that the fins 18 are disposed in the same longitudinal direction as that of the boiling channels 12 and condenser fins 11. The plate fins 18 which are of conventional construction run the entire length of the end plate, i.e. from the bottom edge bar 15 to the top edge bar 15 and from end bar 42 to the other end bar 42. This arrangement provides a parallel heat transfer path which causes the vapor in the condenser 11 to condense and during normal system operation shares the task of heat transfer from power modules located on the plate 10 as hereinafter described. This provides an improvement in overall heat transfer and lower module temperatures than either the air fins or the reflux device alone could provide and yet provides redundancy in the event of failure of the reflux cooling as may be caused by a leak of the coolant.

After the cold plate 10 has been hermetically sealed by brazing or the like, a liquid such as Freon or water is filled into the area containing the boiling channels 12 and the downcomers 16 through the passage 17. The liquid can be filled to a desired level so that power modules clamped or otherwise affixed to the end plate 14 will be adjacent the cooling material in its liquid phase and thereby obtain greater cooling efficiency by converting all of the liquid phase to a vapor phase. After the filling operation is complete, the passage 17 is pinched off and hermetically sealed to prevent linkage of the coolant.

Modules such as power thyristors are placed on one or more areas of end plate 14 in the reflux cooling area defined by the boiling channels 12. The "footprint" of these modules is shown in phantom lines 19 and 20 in FIG. 1. Again, it will be appreciated that there need only be one such "footprint" and there can be more than the two shown. To further stiffen the cold plate, particularly in the region where the greatest heat is generated, i.e. under a "footprint", the boiling channel fins 12 can be cut to form spaces to accommodate snugly therein stiffening bars (not shown). In addition to providing reinforcement, the bars can also be configured with enhanced boiling surface treatments to serve as nucleation points to facilitate boiling of the coolant in the boiling channels.

Figure 3:
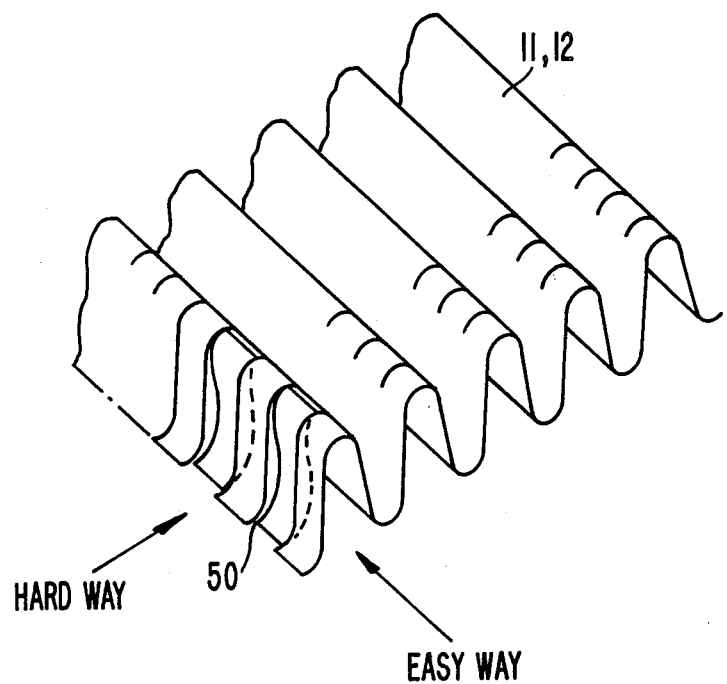
FIG. 3 is a partial perspective view of the conventional lanced offset fins of the type used in the condenser in accordance with the present invention.

As previously mentioned, the fin construction of the condenser region 11 and the boiling channels 12 comprises conventional lanced offset fins 50 as shown in FIG. 3. It will be appreciated that the lanced offset is provided along the entire length of each fin in a known fashion and the offset permits the vapor cooling material to flow along the length of the fin (the easy way) since this direction presents the fewest obstacles to the passage of the material and transversely of the fin (the hard way). This arrangement assures the maximum degree of heat exchange and condensation of the vapor so that it can be returned to the boiling region to effect heat exchange.

In the illustrated embodiment, the lanced fins are arranged in the condenser 11 and the boiling channels 12 so that the easy way is disposed in the long direction of the rectangular cold plate 10 and the hard way is disposed in the short direction thereof. The pressure of the coolant vapor will cause the vapor to flow both the easy way and the hard way in the condenser region 11 to maximize heat transfer. It will be appreciated that design considerations may dictate that the dimensional characteristics of the lanced offset fins in the boiling channels 12 may be different from the condenser fins 11.

Figure 2:
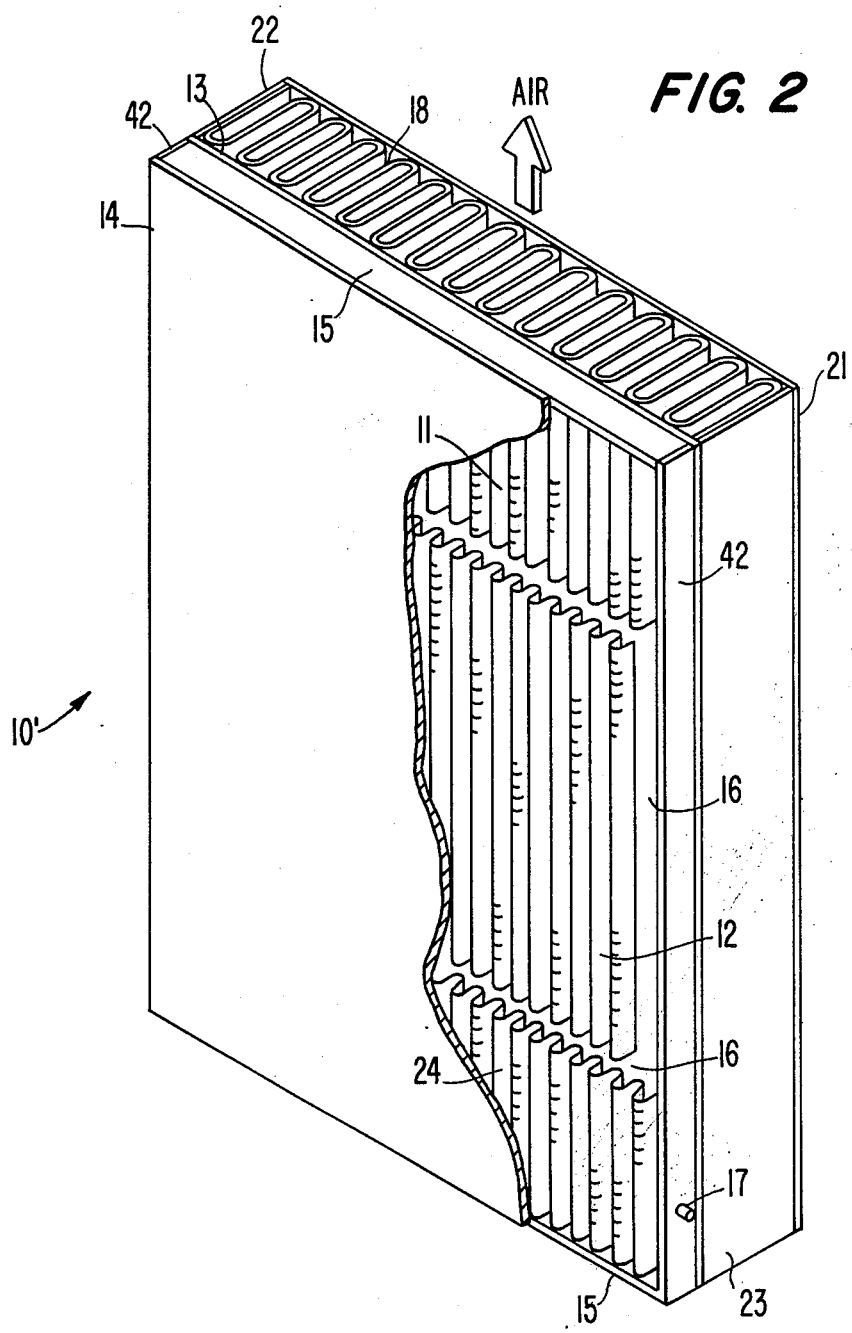
FIG. 2 is a perspective view similar to FIG. 1 but showing another embodiment of the present invention.

FIG. 2 is a perspective view, partially in section, of another embodiment of the present invention wherein parts similar to the parts shown in FIG. 1 use the same reference numerals and perform their previously described functions. In the situation where the plate 10' is to be used in aircraft applications where it can be subjected to inverted operation and negative "g" forces which could prevent movement of the vaporized coolant from the boiling channels 12 to the condenser 11, a second condenser 24 in the form of lanced offset fins similar to the fins in condenser 11 can be provided below the boiling channels 12. Then in the event of inverted operation or negative "g" forces the condenser 24 will automatically take over the condensation of vapor for the reflux operation without any disadvantageous effect on overall heat transfer. The modules to be cooled are attached in a suitable fashion to the end plate opposite the boiling channels 12 as previously discussed.

While several embodiments in accordance with the present invention have been shown and described, it should be clear that the same is susceptible of numerous changes and modifications without departing from the scope of the present invention. For example, the end plate 14 can be thickened where the modules are mounted to enhance spreading of heat and to provide a thermal capacitance to dampen thermal transients in the event air flow through the fins 18 were to be temporarily interrupted. Therefore, this is not intended to be limited to the details disclosed in the specification and drawings but intend to protect all such changes and modifications as are encompassed by the scope of the appended claims.

I claim:

1. A modular reflux cooling plate, for one or more heat generating components, comprising:
   at least one condensing region;
   boiling channels disposed adjacent the at least one condensing region;
   at least one downcomer in the vicinity of the boiling channels so as to be operatively communicated between the at least one condensing region and the boiling channels;
   end plates hermetically sealing the at least one condensing region, the boiling channels and the at least one downcomer therebetween so that a coolant can be provided in the region of the boiling channels, and means for supplying cooling air from the boiling channels to the at least one condensing region arranged adjacent one of the end plates to define a cooling circuit defined by the boiling channels, the at least one condensing region, and the at least one downcomer, wherein the one or more heat generating components are mounted externally on the other of the end plates adjacent the boiling channels to form an assembly adapted to be joined with one or more other modular reflux cooling plates with assemblies thereon for providing shared heat exchange between the at least one condensing region and the cooling air supply means, wherein the at least one condensing region comprises a condensing region above and below the boiling channels.

2. A modular reflux cooling plate for one or more heat generating components, comprising:

at least one condensing region;

boiling channels disposed separate from and adjacent the at least one condensing region;

at least one downcomer in the vicinity of the boiling channels so as to be operatively communicated between the at least one condensing region and the boiling channels;

end plates hermetically sealing the at least one condensing region, the boiling channels and the at least one downcomer therebetween so that a coolant can be provided in the region of the boiling channels, and means for supplying cooling air from the boiling channels to the at least one condensing region arranged adjacent one of the end plates to define a cooling circuit in parallel with a reflux cooling circuit defined by the boiling channels, the at least one condensing region, and the at least one downcomer.

wherein the one or more heat generating components are mounted externally on the other of the end plates adjacent the boiling channels to form an assembly adapted to be joined with one ore more other modular reflux cooling plates with assemblies thereon for providing shared heat exchange between the at least one condensing region and the cooling air supplying means, wherein the at least one condensing region is provided with lanced offset fins.

3. A modular reflux cooling plate, for one or more heat generating components, comprising:

at least one condensing region;

boiling channels disposed separate from and adjacent the at least one condensing region;

at least one downcomer in the vicinity of the boiling channels so as to be operatively communicated between the at least one condensing region and the boiling channels;

end plates hermetically sealing the at least one condensing region, the boiling channels and the at least one downcomer therebetween so that a coolant can be provided in the region of the boiling channels, and means for supplying cooling air from the boiling channels to the at least one condensing region arranged adjacent one of the end plates to define a cooling circuit in parallel with a reflux cooling circuit defined by the boiling channels, the at least one condensing region, and the at least one downcomer, wherein the one or more heat generating components are mounted externally on the other of the end plates adjacent the boiling channels to form an assembly adapted to be joined with one or more other modular reflux cooling plates with assemblies thereon for providing shared heat exchange between the at least one condensing region and the cooling air supplying means, wherein the boiling channels are defined by lanced offset fins.

4. A modular reflux cooling plate for one or more heat generating components, comprising:

at least one condensing region wherein the at least one condensing region comprises a condensing region above and below the boiling channels;

boiling channels disposed adjacent the at least one condensing region;

downcomers provided on each side of the boiling channels so as to operatively communicated between the at least one condensing region and the boiling channels;

end plates hermetically sealing the at least one condensing region, the boiling channels and the at least one downcomer therebetween so that a coolant can be provided in the region of the boiling channels, and means for supplying cooling air from the boiling channels to the at least one condensing region arranged adjacent one of the end plates to define a cooling circuit in parallel with a reflux cooling circuit defined by the boiling channels, the at least one condensing region, and the at least one downcomer, wherein the one or more heat generating components are mounted externally on the other of the end plates adjacent the boiling channels to form an assembly adapted to be joined with one or more other modular reflux cooling plates with assemblies thereon for providing shared heat exchange between the at least one condensing region and the cooling air supplying means.

5. A modular reflux cooling plate according to claim 4, wherein the at least one condensing region is provided with lanced offset fins.

6. A modular reflux cooling plate according to claim 5, wherein the boiling channels are defined by lanced offset fins.

* * * * *